United States Patent
Ozawa et al.

(10) Patent No.: US 10,091,586 B2
(45) Date of Patent: Oct. 2, 2018

(54) ELECTROACOUSTIC TRANSDUCTION FILM AND ELECTROACOUSTIC TRANSDUCER

(71) Applicant: FUJIFILM Corporation, Tokyo (JP)

(72) Inventors: Shin Ozawa, Ashigara-kami-gun (JP); Daisuke Inoue, Ashigara-kami-gun (JP); Tetsu Miyoshi, Ashigara-kami-gun (JP)

(73) Assignee: FUJIFIRM Corporation, Tokyo (JP)

(*) Notice: Subject to any disclaimer, the term of this patent is extended or adjusted under 35 U.S.C. 154(b) by 0 days.

(21) Appl. No.: 15/841,617

(22) Filed: Dec. 14, 2017

(65) Prior Publication Data

US 2018/0109880 A1 Apr. 19, 2018

Related U.S. Application Data

(63) Continuation of application No. PCT/JP2016/066948, filed on Jun. 7, 2016.

(30) Foreign Application Priority Data

Jun. 23, 2015 (JP) .................................. 2015-125724
Jan. 6, 2016 (JP) .................................. 2016-001287

(51) Int. Cl.
*H01L 41/09* (2006.01)
*H01L 41/047* (2006.01)
(Continued)

(52) U.S. Cl.
CPC ....... *H04R 17/005* (2013.01); *H01L 41/0533* (2013.01); *H01L 41/09* (2013.01)

(58) Field of Classification Search
CPC .... H04R 17/005; H01L 41/0533; H01L 41/09
(Continued)

(56) References Cited

U.S. PATENT DOCUMENTS 4,786,837 A * 11/1988 Kalnin .................. B06B 1/0688
  310/330
4,900,972 A *  2/1990 Wersing .................. H01L 41/29
  310/364

(Continued)

FOREIGN PATENT DOCUMENTS

| JP | 56-167698 | 12/1981 |
| JP | 61-191698 U | 11/1986 |

(Continued)

OTHER PUBLICATIONS

International Search Report issued in PCT/JP2016/066948 (PCT/ISA/210), dated Aug. 9, 2016.
Written Opinion of the International Searching Authority issued in PCT/JP2016/066948 (PCT/ISA/237), dated Aug. 9, 2016.

*Primary Examiner* — Thomas Dougherty

(74) *Attorney, Agent, or Firm* — Birch, Stewart, Kolasch & Birch, LLP

(57) ABSTRACT

Provided are an electroacoustic transduction film and an electroacoustic transducer capable of reproducing a sound with a sufficient sound volume and preventing deterioration of appearance. The electroacoustic transduction film includes: a polymer composite piezoelectric body in which piezoelectric body particles are dispersed in a viscoelastic matrix formed of a polymer material having viscoelasticity at a normal temperature; a lower thin film electrode laminated on one principal surface of the polymer composite piezoelectric body; a lower protective layer laminated on the lower thin film electrode; an upper thin film electrode formed on the other principal surface of the polymer composite piezoelectric body; an upper protective layer laminated on the upper thin film electrode; and a colored layer laminated on at least one of a surface layer side of the upper thin film electrode and a surface layer side of the lower thin film electrode.

18 Claims, 5 Drawing Sheets

(51) Int. Cl.
*H01L 41/18* (2006.01)
*H04R 17/00* (2006.01)
*H01L 41/053* (2006.01)

(58) Field of Classification Search
USPC ................................. 310/340, 364, 365, 800
See application file for complete search history.

(56) References Cited

U.S. PATENT DOCUMENTS

| | | | | |
|---|---|---|---|---|
| 5,367,500 | A * | 11/1994 | Ng | H01L 41/1132 310/328 |
| 8,310,138 | B2 * | 11/2012 | Nagai | H01B 1/24 310/330 |
| 8,350,448 | B2 * | 1/2013 | Nagai | H01B 1/24 310/328 |
| 8,405,280 | B2 * | 3/2013 | Ochi | H01L 41/29 310/328 |
| 8,680,741 | B2 * | 3/2014 | Kim | G06F 3/016 310/311 |
| 9,761,784 | B2 * | 9/2017 | Miyoshi | H01L 41/0805 |
| 2014/0210309 | A1 * | 7/2014 | Miyoshi | H04R 7/04 310/313 A |

FOREIGN PATENT DOCUMENTS

| | | |
|---|---|---|
| JP | 1-197903 A | 8/1989 |
| JP | 2014-14063 A | 1/2014 |

\* cited by examiner

ELECTROACOUSTIC TRANSDUCTION FILM AND ELECTROACOUSTIC TRANSDUCER

CROSS-REFERENCE TO RELATED APPLICATIONS

This application is a Continuation of PCT International Application No. PCT/JP2016/066948 filed on Jun. 7, 2016, which claims priority under 35 U.S.C. § 119(a) to Japanese Patent Application No. 2015-125724 filed on Jun. 23, 2015 and Japanese Patent Application No. 2016-001287 filed on Jan. 6, 2016. Each of the above applications is hereby expressly incorporated by reference, in its entirety, into the present application.

BACKGROUND OF THE INVENTION

1. Field of the Invention

The present invention relates to an electroacoustic transduction film and an electroacoustic transducer used for an acoustic device such as a speaker.

2. Description of the Related Art

In response to thinning of displays such as liquid crystal displays and organic electroluminescence (EL) displays, speakers used in such thin displays are also required to be lighter and thinner.

Here, as the shape of a speaker of the related art, a so-called cone shape such as a funnel-like shape, a spherical dome-like shape, and the like are generally used. However, in a case where such a speaker is embedded in the thin display described above, there is concern that thinning may not be sufficiently achieved and lightweight properties may be impaired. In addition, in a case where the speaker is attached to the outside of the thin display, it is difficult to carry the thin display.

Here, as a speaker which is thin and is able to be integrated with a thin display or a flexible display without impairing the lightweight properties, it has been proposed to use a piezoelectric film which has flexibility in the form of a sheet and has a property that stretches and contracts in response to an applied voltage.

Here, the present applicants suggested, as a piezoelectric film which has flexibility in the form of a sheet and is able to stably reproduce a sound with high acoustic quality, an electroacoustic transduction film disclosed in JP2014-14063A. The electroacoustic transduction film disclosed in JP2014-14063A includes a polymer composite piezoelectric body (piezoelectric layer) in which piezoelectric body particles are dispersed in a viscoelastic matrix formed of a polymer material having viscoelasticity at a normal temperature, thin film electrodes formed on both surfaces of the polymer composite piezoelectric body, and protective layers formed on the surfaces of the thin film electrodes.

SUMMARY OF THE INVENTION

In such an electroacoustic transduction film, the transduction film itself stretches and contracts in the surface direction thereof in response to an applied voltage and vibrates in a direction perpendicular to the surface, thereby performing a conversion between a vibration (sound) and an electrical signal. Therefore, in order to further improve the sound pressure, the transduction film needs to be thinner to enhance responsiveness. In the transduction film, since the thin film electrode is extremely thin, the thickness of the transduction film is substantially determined by the thickness of the piezoelectric layer and the thickness of the protective layer in practice. However, in order to exhibit sufficient piezoelectric properties, the piezoelectric layer needs a certain degree of thickness. Therefore, it is considered that the thickness of the transduction film is reduced by reducing the thickness of the protective layer in order to further improve the sound pressure.

From a viewpoint of conductivity, flexibility, and the like, a copper electrode is mainly used as the thin film electrode of the transduction film. However, in the case of using the copper electrode as the thin film electrode, there is a problem that the copper electrode rusts over time and deterioration of appearance occurs.

In order to prevent the deterioration of appearance due to the rusting, imparting gas barrier properties to the protective layer to suppress rusting is considered. However, as described above, since the protective layer needs to be thinner in order to improve the sound pressure, it is difficult to impart sufficient gas barrier properties to the protective layer.

In addition, it is considered that by coloring the protective layer, the rust of the thin film electrode is not allowed to be recognized from the outside. However, in a case where the protective layer is made thinner in order to improve the sound pressure as described above, it becomes difficult to sufficiently color the protective layer, which also results in the deterioration of appearance.

An object of the present invention is to solve such a problem of the related art, and is to provide an electroacoustic transduction film and an electroacoustic transducer capable of reproducing a sound with a sufficient sound volume and preventing deterioration of appearance.

The present inventors have intensively studied to attain the object, and found that by providing a polymer composite piezoelectric body in which piezoelectric body particles are dispersed in a viscoelastic matrix formed of a polymer material having viscoelasticity at a normal temperature, a lower thin film electrode laminated on one principal surface of the polymer composite piezoelectric body, a lower protective layer laminated on the lower thin film electrode, an upper thin film electrode formed on the other principal surface of the polymer composite piezoelectric body, an upper protective layer laminated on the upper thin film electrode, and a colored layer laminated on at least one of a surface layer side of the upper thin film electrode and a surface layer side of the lower thin film electrode, the problem can be solved, thereby completing the present invention.

That is, the present invention provides an electroacoustic transduction film and an electroacoustic transducer having the following configuration.

(1) An electroacoustic transduction film comprising: a polymer composite piezoelectric body in which piezoelectric body particles are dispersed in a viscoelastic matrix formed of a polymer material having viscoelasticity at a normal temperature; a lower thin film electrode laminated on one principal surface of the polymer composite piezoelectric body; a lower protective layer laminated on the lower thin film electrode; an upper thin film electrode formed on the other principal surface of the polymer composite piezoelectric body; an upper protective layer laminated on the upper thin film electrode; and a colored layer laminated on at least one of a surface layer side of the upper thin film electrode and a surface layer side of the lower thin film electrode.

(2) The electroacoustic transduction film according to (1), in which the colored layer is laminated at least one of between the upper thin film electrode and the upper protective layer or between the lower thin film electrode and the lower protective layer.

(3) The electroacoustic transduction film according to (1) or (2), in which the colored layer is laminated on both principal surface sides of the polymer composite piezoelectric body.

(4) The electroacoustic transduction film according to any one of (1) to (3), in which a transmission density of the colored layer is more than or equal to 0.3.

(5) The electroacoustic transduction film according to any one of (1) to (4), in which a thickness of the colored layer is less than or equal to 40 nm.

(6) The electroacoustic transduction film according to any one of (1) to (5), in which an electrical resistivity of the colored layer is less than or equal to $1 \times 10^{-7}$ Ωm.

(7) The electroacoustic transduction film according to any one of (1) to (6), in which the colored layer is made of metal.

(8) The electroacoustic transduction film according to any one of (1) to (7), in which the colored layer is made of nickel.

(9) The electroacoustic transduction film according to any one of (1) to (8), in which the polymer material has a cyanoethyl group.

(10) An electroacoustic transducer comprising: the electroacoustic transduction film according to any one of (1) to (9).

According to the present invention, it is possible to provide the electroacoustic transduction film and the electroacoustic transducer capable of reproducing a sound with a sufficient sound volume and preventing deterioration of appearance.

DESCRIPTION OF THE PREFERRED EMBODIMENTS

Hereinafter, an electroacoustic transduction film and an electroacoustic transducer of the present invention will be described in detail based on the preferred embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

As will be described later, the electroacoustic transduction film of the present invention is used as a vibration plate of the electroacoustic transducer.

In the electroacoustic transducer, in a case where the electroacoustic transduction film is stretched in an in-plane direction due to the application of a voltage to the electroacoustic transduction film, the electroacoustic transduction film moves upward (in the radial direction of sound) in order to absorb the stretching. Conversely, in a case where the electroacoustic transduction film is contracted in the in-plane direction due to the application of a voltage to the electroacoustic transduction film, the electroacoustic transduction film moves downward (toward a case) in order to absorb the contraction. The electroacoustic transducer performs a conversion between a vibration (sound) and an electrical signal by the vibrations caused by repetition of stretching and contraction of the electroacoustic transduction film, and is used to reproduce a sound from a vibration in response to an electrical signal by inputting the electrical signal to the electroacoustic transduction film, convert a vibration of the electroacoustic transduction film from the received sound waves into an electrical signal, or impart tactility or transport an object from vibrations.

Specifically, various acoustic devices including a speaker such as a full-range speaker, a tweeter, a squawker, and a woofer, a speaker for a headphone, a noise canceller, a microphone, a pickup used in musical instruments including a guitar, and the like can be cited. In addition, the electroacoustic transduction film of the present invention is a non-magnetic body, and thus is able to be suitably used as a noise canceller for MRI among other noise cancellers.

Furthermore, the electroacoustic transducer of the present invention is thin, lightweight, and bendable, and thus is suitably used in wearable products such as hats, mufflers and clothes, thin displays such as televisions and digital signages, ceilings of buildings and automobiles, curtains, umbrellas, wallpapers, windows, beds, and the like.

Figure 1:
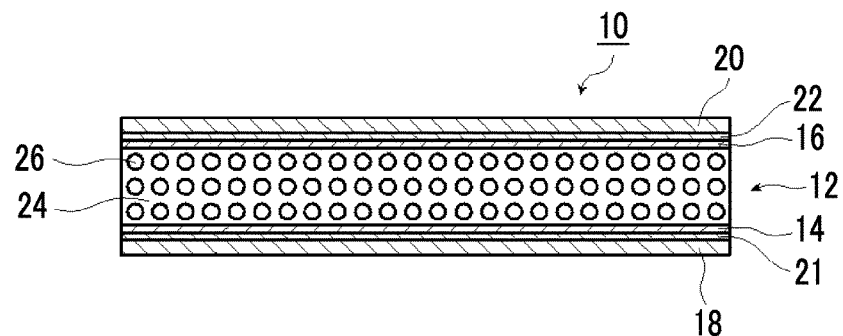
FIG. 1 is a sectional view schematically illustrating an example of an electroacoustic transduction film of the present invention.

FIG. 1 is a sectional view schematically illustrating an example of the electroacoustic transduction film of the present invention.

As illustrated in FIG. 1, an electroacoustic transduction film (hereinafter, also referred to as "transduction film") 10 of the present invention has a piezoelectric layer 12 which is a sheet-like material having piezoelectric properties, a lower thin film electrode 14 laminated on one surface of the piezoelectric layer 12, a lower colored layer 21 laminated on the lower thin film electrode 14, a lower protective layer 18 laminated on the lower colored layer 21, an upper thin film electrode 16 laminated on the other surface of the piezoelectric layer 12, an upper colored layer 22 laminated on the upper thin film electrode 16, and an upper protective layer 20 laminated on the upper colored layer 22.

In the transduction film 10, the piezoelectric layer 12 which is a polymer composite piezoelectric body, as conceptually illustrated in FIG. 1, is a polymer composite piezoelectric body in which piezoelectric body particles 26 are uniformly dispersed in a viscoelastic matrix 24 formed of a polymer material having viscoelasticity at a normal temperature. Furthermore, herein, the "normal temperature" indicates a temperature range of approximately 0° C. to 50° C.

Although described later, the piezoelectric layer 12 is preferably subjected to polarization processing.

Here, it is preferable that the polymer composite piezoelectric body (the piezoelectric layer) 12 has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, in a case where the polymer composite piezoelectric body is hard, large bending stress is generated to that extent, and a crack is generated at the interface between the polymer matrix and the piezoelectric body particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy such that a sound is reproduced. Accordingly, in order to increase the transmission efficiency of the vibration energy, the polymer composite piezoelectric body is required to have suitable hardness. In addition, in a case where the frequency properties of the speaker become smooth, the changed amount of the acoustic quality at the time of when the lowest resonance frequency $f_0$ changes according to a change in the curvature also decreases. Accordingly, the loss tangent of the polymer composite piezoelectric body is required to be suitably large.

As described above, the polymer composite piezoelectric body is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time of when the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, in a case where a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 24 using such a polymer material having viscoelasticity at a normal temperature, as necessary, may use a plurality of polymer materials in combination.

That is, in order to adjust dielectric properties or mechanical properties, other dielectric polymer materials may be added to the viscoelastic matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the viscoelastic matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the viscoelastic matrix 24 of the piezoelectric layer 12, the added amount at the time of adding a polymer in addition to the viscoelastic material such as cyanoethylated PVA is not particularly limited, and it is preferable that a ratio of the added polymer to the viscoelastic matrix 24 is less than or equal to 30 vol %.

Accordingly, it is possible to exhibit properties of the polymer material to be added without impairing the viscoelasticity relieving mechanism of the viscoelastic matrix 24, and thus a preferred result is able to be obtained from a viewpoint of increasing a dielectric constant, of improving heat resistance, and of improving adhesiveness between the piezoelectric body particles 26 and the electrode layer.

In addition, for the purpose of increasing the dielectric constant of the piezoelectric layer 12, dielectric particles may be added to the viscoelastic matrix.

The dielectric particles are formed of particles having a relative permittivity as high as 80 or more at 25° C.

As the dielectric particles, lead zirconate titanate (PZT), barium titanate ($BaTiO_3$), titanium oxide ($TiO_2$), strontium titanate ($SrTiO_3$), lead lanthanum zirconate titanate (PLZT), zinc oxide (ZnO), a solid solution (BFBT) of barium titanate and bismuth ferrite ($BiFeO_3$), and the like are exemplified. Among them, it is preferable to use barium titanate ($BaTiO_3$) as the dielectric particles from a viewpoint of having a high relative permittivity.

It is preferable that the average particle diameter of the dielectric particles is less than or equal to 0.5 µm.

In addition, the volume fraction of the dielectric particles with respect to the total volume of the viscoelastic matrix and the dielectric particles is preferably 5% to 45%, more preferably 10% to 30%, and particularly preferably 20% to 30%.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

The particle diameter of the piezoelectric body particles 26 may be appropriately selected according to the size or usage of the transduction film 10, and is preferably 1 µm to 10 µm according to the consideration of the present inventors.

By setting the particle diameter of the piezoelectric body particles 26 to be in the range described above, a preferred result is able to be obtained from a viewpoint of making high piezoelectric properties and flexibility compatible.

In addition, in FIG. 1, the piezoelectric body particles 26 in the piezoelectric layer 12 are uniformly dispersed in the viscoelastic matrix 24 with regularity. However, the present invention is not limited thereto.

That is, in the viscoelastic matrix 24, the piezoelectric body particles 26 in the piezoelectric layer 12 are preferably uniformly dispersed, and may also be irregularly dispersed.

In the transduction film 10, a quantitative ratio of the viscoelastic matrix 24 and the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the viscoelastic matrix 24 and the piezoelectric body particles 26 to be in the range described above, it is possible to obtain a preferred result from a viewpoint of making high piezoelectric properties and flexibility compatible.

In addition, in the transduction film 10, the thickness of the piezoelectric layer 12 is also not particularly limited, and may be appropriately set according to the size of the transduction film 10, the usage of the transduction film 10, properties required for the transduction film 10, and the like.

Here, according to the consideration of the present inventors, the thickness of the piezoelectric layer 12 is preferably 8 µm to 300 µm, more preferably 8 to 40 µm, even more preferably 10 to 35 µm and particularly preferably 15 to 25 µm.

By setting the thickness of the piezoelectric layer 12 to be in the range described above, it is possible to obtain a preferred result from a viewpoint of making ensuring rigidity and appropriate flexibility compatible.

Furthermore, as described above, it is preferable that the piezoelectric layer 12 is subjected to polarization processing (poling). The polarization processing will be described below in detail.

As illustrated in FIG. 1, the transduction film 10 of the present invention has a configuration in which the lower thin film electrode 14 is formed on one surface of the piezoelectric layer 12, the lower colored layer 21 is formed on the lower thin film electrode 14, the lower protective layer 18 is formed on the lower colored layer 21, the upper thin film electrode 16 is formed on the other surface of the piezoelectric layer 12, the upper colored layer 22 is formed on the upper thin film electrode 16, and the upper protective layer 20 is formed on the upper colored layer 22. Here, the upper thin film electrode 16 and the lower thin film electrode 14 form an electrode pair.

In addition to these layers, the transduction film 10 may further include, for example, an electrode lead-out portion that leads out the electrodes from the upper thin film electrode 16 and the lower thin film electrode 14, and an insulating layer which covers a region where the piezoelectric layer 12 is exposed for preventing a short circuit or the like.

As the electrode lead-out portion, the thin film electrode and the protective layer are provided with parts protruding in a convex shape on the outside in the surface direction of the piezoelectric layer. Alternatively, the electrode lead-out portion may be provided by forming a hole by removing a portion of the protective layer, inserting a conductive material such as a silver paste into the hole, and electrically connecting the conductive material and the thin film electrode.

In each of the thin film electrodes, the number of electrode lead-out portions is not limited to one, and two or more electrode lead-out portions may be included. Particularly, in a case of the configuration in which the electrode lead-out portion is provided by removing a portion of the protective layer and inserting the conductive material into the hole, three or more electrode lead-out portions are provided to ensure more reliable electrical connection.

That is, the transduction film 10 has a configuration in which both surfaces of the piezoelectric layer 12 are interposed between the electrode pair, that is, the upper thin film electrode 16 and the lower thin film electrode 14 and this laminated body is interposed between the upper colored layer 22 and the lower colored layer 21 and is further interposed between the upper protective layer 20 and the lower protective layer 18.

The region interposed between the upper thin film electrode 16 and the lower thin film electrode 14 as described above is driven according to an applied voltage.

In the transduction film 10, the upper protective layer 20 and the lower protective layer 18 have a function of covering the upper thin film electrode 16 and the lower thin film electrode 14 and applying appropriate rigidity and mechanical strength to the piezoelectric layer 12. That is, there may be a case where, in the transduction film 10 of the present invention, the piezoelectric layer 12 consisting of the viscoelastic matrix 24 and the piezoelectric body particles 26 exhibits extremely superior flexibility under bending deformation at a slow vibration but has insufficient rigidity or mechanical strength depending on the usage. As a compensation for this, the transduction film 10 is provided with the upper protective layer 20 and the lower protective layer 18.

The upper protective layer 20 and the lower protective layer 18 are not particularly limited, and may use various sheet-like materials. As an example, various resin films are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyamide (PA), polyethylene naphthalate (PEN), triacetylcellulose (TAC), and a cyclic olefin-based resin are suitably used.

The thicknesses of the upper protective layer 20 and the lower protective layer 18 are not particularly limited. In addition, the thicknesses of the upper protective layer 20 and the lower protective layer 18 may basically be identical to each other or different from each other.

Here, in a case where the rigidity of the upper protective layer 20 and the lower protective layer 18 excessively increases, not only is the stretching and contracting of the piezoelectric layer 12 constrained, but also the flexibility is impaired, and thus it is advantageous in a case where the thicknesses of the upper protective layer 20 and the lower protective layer 18 become thinner unless mechanical strength or excellent handling ability as a sheet-like material is required.

According to the consideration of the present inventors, the thickness of the upper protective layer 20 and the lower protective layer 18 is preferably less than or equal to 50 µm, more preferably less than or equal to 25 µm, and particularly preferably less than or equal to 10 µm.

In the transduction film 10, the upper thin film electrode (hereinafter, also referred to as an upper electrode) 16 is formed between the piezoelectric layer 12 and the upper protective layer 20, and the lower thin film electrode (hereinafter, also referred to as a lower electrode) 14 is formed between the piezoelectric layer 12 and the lower protective layer 18.

The upper electrode 16 and the lower electrode 14 are provided to apply an electric field to the transduction film 10 (the piezoelectric layer 12).

In the present invention, a forming material of the upper electrode 16 and the lower electrode 14 is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, a conductive polymer such as PEDOT/PPS (polyethylenedioxythiophene-polystyrene sulfonate) are exemplified. Among them, any one of copper, aluminum, gold, silver, platinum, and indium-tin oxide is suitably exemplified. From a viewpoint of conductivity, costs, flexibility, and the like, copper is more preferable.

In addition, a forming method of the upper electrode 16 and the lower electrode 14 is not particularly limited, and as the forming method, various known methods such as a vapor-phase deposition method (a vacuum film forming method) such as vacuum vapor deposition or sputtering, film formation using plating, a method of adhering a foil formed of the materials described above, and an application method are able to be used.

Among them, in particular, by the reason that the flexibility of the transduction film 10 is able to be ensured, a copper or aluminum thin film formed by using the vacuum vapor deposition is suitably used as the upper electrode 16 and the lower electrode 14. Among them, in particular, the copper thin film formed by using the vacuum vapor deposition is suitably used.

The thicknesses of the upper electrode 16 and the lower electrode 14 are not particularly limited. In addition, the thicknesses of the upper electrode 16 and the lower electrode 14 may basically be identical to each other or different from each other.

Here, like the upper protective layer 20 and the lower protective layer 18 described above, in a case where the rigidity of the upper electrode 16 and the lower electrode 14 excessively increases, not only is stretching and contracting of the piezoelectric layer 12 constrained, but also flexibility is impaired. For this reason, in a case where the upper electrode 16 and the lower electrode 14 are in a range where electrical resistance does not excessively increase, it is advantageous in a case where the thickness becomes thinner.

According to the consideration of the present inventors, the thickness of the upper electrode 16 and the lower electrode 14 is preferably less than or equal to 1.2 µm, more preferably less than or equal to 0.3 µm, and particularly preferably less than or equal to 0.1 µm.

In the transduction film 10, the upper colored layer 22 is formed between the upper electrode 16 and the upper protective layer 20, and the lower colored layer 21 is formed between the lower electrode 14 and the lower protective layer 18.

The upper colored layer 22 and the lower colored layer 21 are formed so as not to allow rusting of the upper electrode 16 and the lower electrode 14 to be visible from the outside.

From a viewpoint of not allowing rusting of the upper electrode 16 and the lower electrode 14 to be visible from the outside, the transmission density of the upper colored layer 22 and the lower colored layer 21 is preferably more than or equal to 0.3, and more preferably more than or equal to 0.5.

The transmission density is an optical density measured as a ratio of transmitted light to incoming rays. The transmittance at a transmission density of 0.3 is about 50%, and the transmittance at a transmission density of 0.5 is about 30%.

Furthermore, like the upper protective layer 20, the lower protective layer 18, the upper electrode 16, and the lower electrode 14 described above, in a case where the rigidity of the upper colored layer 22 and the lower colored layer 21 excessively increases, not only is stretching and contracting of the piezoelectric layer 12 constrained, but also flexibility is impaired. For this reason, in a case where the upper colored layer 22 and the lower colored layer 21 are in a range where the transmission density is not excessively low, it is advantageous in the case where the thickness becomes thinner.

According to the consideration of the present inventors, the thickness of the upper colored layer 22 and the lower colored layer 21 is preferably less than or equal to 1 µm, more preferably less than or equal to 100 nm, and particularly preferably less than or equal to 40 nm.

The electrical resistivity of the upper colored layer 22 and the lower colored layer 21 is preferably low, and is preferably less than or equal to $1 \times 10^{-7}$ Ωm.

In the transduction film 10, as one of the methods to lead out an electrode from the upper electrode 16 and the lower electrode 14, there is a method of forming an electrode lead-out portion by forming a hole by removing a portion of the protective layer, inserting a conductive material such as a silver paste into the hole, and electrically connecting the conductive material and the thin film electrode. In a case of forming the electrode lead-out portion using such a method, in a case where the electrical resistivity of the upper colored layer 22 and the lower colored layer 21 is high, removing a portion of the protective layer is not enough to electrically connect the conductive material and the thin film electrode. Therefore, there is a need to also remove the upper colored layer 22 and the lower colored layer 21 at the position of the hole, resulting in poor productivity.

Therefore, it is preferable to electrically connect the conductive material and the thin film electrode by reducing the electrical resistivity of the upper colored layer 22 and the lower colored layer 21 without removing the upper colored layer 22 and the lower colored layer 21 at the position of the hole.

In the present invention, a forming material of the upper colored layer 22 and the lower colored layer 21 is not particularly limited as long as the forming material satisfies the transmission density and is not discolored by rusting or the like.

Specifically, as the forming material of the upper colored layer 22 and the lower colored layer 21, metals such as nickel, titanium, aluminum, gold, and platinum, inorganic pigments such as carbon black (CB), titanium oxide, zinc oxide, barium sulfate, organic pigments based on quinacridone, azo, benzimidazolone, phthalocyanine, and anthraquinone, a member having pores therein and having light scattering properties, and the like are exemplified.

From a viewpoint of the transmission density, the thickness, and the electrical resistivity, metals are preferably used as the forming material of the upper colored layer 22 and the lower colored layer 21, and among them, nickel is more preferable.

From a viewpoint of designability that causes the transduction film to be colored in various colors, it is preferable to use various pigments as the upper colored layer 22 and the lower colored layer 21.

In addition, a forming method of the upper colored layer 22 and the lower colored layer 21 is not particularly limited, and the upper colored layer 22 and the lower colored layer 21 may be formed in various known methods depending on the materials.

For example, in a case of using metals as the forming material of the colored layer, a vapor-phase deposition method (a vacuum film forming method) such as vacuum vapor deposition or sputtering, film formation using plating, a method of adhering a foil formed of the materials described above, and the like are able to be used. It is preferable to form the colored layer using vacuum vapor deposition from a viewpoint of forming the colored layer to be thinner.

In the case of using the pigments as the forming material of the colored layer, an application method, printing, and the like are able to be used.

In addition, a method of transferring the colored layer formed in advance is also able to be used.

In the illustrated example, the upper colored layer 22 and the lower colored layer 21 are configured to be respectively formed between the upper electrode 16 and the upper protective layer 20 and between the lower electrode 14 and the lower protective layer 18, but are not limited thereto, and a configuration in which the upper colored layer 22 and the lower colored layer 21 are respectively formed on the surface layer side of the upper electrode 16 and the surface layer side of the lower electrode 14 may be provided. That is, for example, a configuration in which the upper electrode 16, the upper protective layer 20, and the upper colored layer 22 are formed on one surface of the piezoelectric layer 12 in this order and the lower electrode 14, the lower protective layer 18, and the lower colored layer 21 are formed on the other surface of the piezoelectric layer 12 in this order may be provided.

Furthermore, in the illustrated example, the configuration in which the colored layers are respectively provided on the upper electrode 16 side and the lower electrode 14 side is provided. However, the present invention is not limited thereto, and a configuration in which the colored layer is provided on at least one side may be provided. In this case, it is preferable that the colored layer is provided on the surface on the visible side (the surface facing the outside of the device) in a case where the colored layer is assembled in an electroacoustic transducer.

In addition, in addition to the thin film electrodes, the protective layers, the colored layers, and the like described above, the transduction film of the present invention may include a functional layer such as an adhesiveness imparting layer or an antioxidant layer.

As described above, the transduction film 10 has a configuration in which the piezoelectric layer 12 in which the piezoelectric body particles 26 are dispersed in the viscoelastic matrix 24 having viscoelasticity at a normal temperature is interposed between the upper electrode 16 and the lower electrode 14 and the laminated body is interposed between the upper colored layer 22 and the lower colored layer 21 and is further interposed between the upper protective layer 20 and the lower protective layer 18.

In the transduction film 10, it is preferable that the local maximum value in which the loss tangent (Tan δ) at a frequency of 1 Hz according to the dynamic viscoelasticity measurement is greater than or equal to 0.1 exists at a normal temperature.

Accordingly, even in a case where the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time of when the lowest resonance frequency $f_0$ is changed according to the change in the curvature of the speaker.

Hereinafter, an example of a manufacturing method of the transduction film 10 will be described with reference to FIGS. 2A to 2E.

Figure 2A:
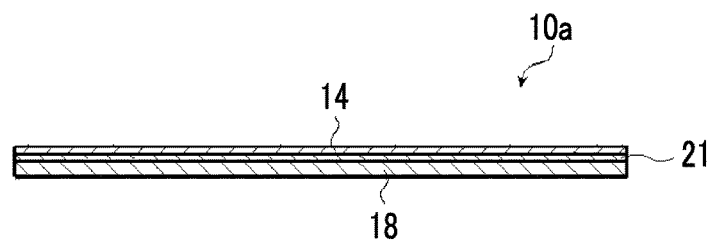
FIG. 2A is a conceptual view illustrating an example of a manufacturing method of the electroacoustic transduction film.

First, as illustrated in FIG. 2A, a sheet-like material 11a is prepared in which the lower colored layer 21 is formed on the lower protective layer 18 and the lower electrode 14 is formed on the lower colored layer 21. The sheet-like material 11a may be prepared by forming the lower colored layer 21 on the surface of the lower protective layer 18 using vacuum vapor deposition, sputtering, plating, application, printing, or the like and then forming a copper thin film or the like as the lower electrode 14 on the surface of the formed lower colored layer 21 using vacuum vapor deposition, sputtering, plating, or the like.

In a case where the lower protective layer 18 is extremely thin, and thus the handling ability is degraded, the lower protective layer 18 with a separator (temporary supporter) may be used as necessary. As the separator, a PET film having a thickness of approximately 25 to 100 μm, and the like are able to be used. The separator may be removed after thermal compression bonding of the thin film electrode and the protective layer immediately before forming a side surface insulating layer, a second protective layer, and the like.

On the other hand, a coating material is prepared by dissolving a polymer material (hereinafter, also referred to as a viscoelastic material) having viscoelasticity at a normal temperature, such as cyanoethylated PVA, in an organic solvent, further adding the piezoelectric body particles 26 such as PZT particles thereto, and stirring and dispersing the resultant. The organic solvent is not particularly limited, and as the organic solvent, various organic solvents such as dimethylformamide (DMF), methyl ethyl ketone, and cyclohexanone are able to be used.

In a case where the sheet-like material 11a described above is prepared and the coating material is prepared, the coating material is cast (applied) onto the surface of the sheet-like material, and the organic solvent is evaporated and dried. Accordingly, as illustrated in FIG. 2B, a laminated body 11b in which the lower colored layer 21 is provided on the lower protective layer 18, the lower electrode 14 is provided on the lower colored layer 21, and the piezoelectric layer 12 is formed on the lower electrode 14 is prepared.

A casting method of the coating material is not particularly limited, and as the casting method, all known methods (coating devices) such as a slide coater or a doctor blade are able to be used.

Figure 2B:
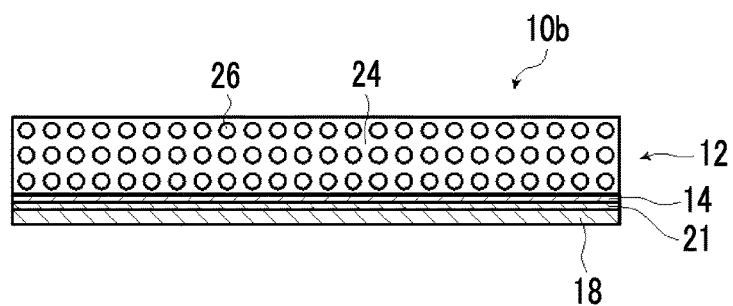
FIG. 2B is a conceptual view illustrating the example of the manufacturing method of the electroacoustic transduction film.

Alternatively, in a case where the viscoelastic material is a material that is able to be heated and melted like cyanoethylated PVA, a melted material is prepared by heating and melting the viscoelastic material and adding and dispersing the piezoelectric body particles 26 therein, is extruded into a sheet shape on the sheet-like material 11a illustrated in FIG. 2A by extrusion molding or the like, and is cooled, thereby preparing the laminated body 11b as illustrated in FIG. 2B.

In addition, as described above, in the transduction film 10, in addition to the viscoelastic material such as cyanoethylated PVA, a polymer piezoelectric material such as PVDF may be added to the viscoelastic matrix 24.

In the case where the polymer piezoelectric material is added to the viscoelastic matrix 24, the polymer piezoelectric material added to the coating material may be dissolved.

Alternatively, the polymer piezoelectric material to be added may be added to the heated and melted viscoelastic material and may be heated and melted.

In the case where the laminated body 11b in which the lower colored layer 21 and the lower electrode 14 are provided on the lower protective layer 18 and the piezoelectric layer 12 is formed on the lower electrode 14, is prepared, it is preferable that the piezoelectric layer 12 is subjected to polarization processing (poling).

A polarization processing method of the piezoelectric layer 12 is not particularly limited, and as the polarization processing method, a known method is able to be used.

Figure 2C:
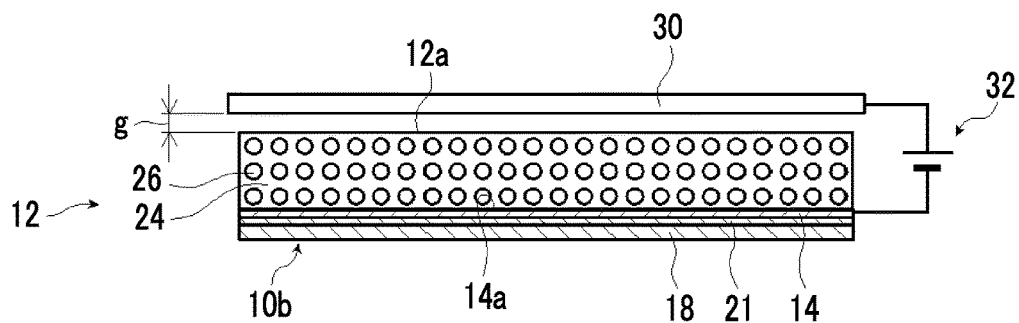
FIG. 2C is a conceptual view illustrating the example of the manufacturing method of the electroacoustic transduction film.
Figure 2D:
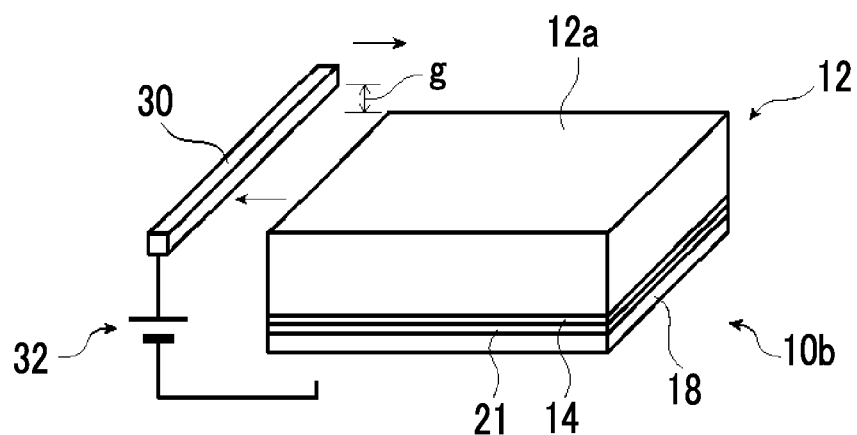
FIG. 2D is a conceptual view illustrating the example of the manufacturing method of the electroacoustic transduction film.

As a preferred polarization processing method, a method illustrated in FIGS. 2C and 2D is exemplified.

In this method, as illustrated in FIGS. 2C and 2D, for example, a gap g of 1 mm is opened on an upper surface 12a of the piezoelectric layer 12 of the laminated body 11b, and a rod-like or wire-like corona electrode 30 which is able to be moved along the upper surface 12a is provided. Then, the corona electrode 30 and the lower electrode 14 are connected to a direct-current power source 32.

Furthermore, heating means for heating and holding the laminated body 11b, for example, a hot plate, is prepared.

Then, in a state where the piezoelectric layer 12 is heated and held by the heating means, for example, at a temperature of 100° C., a direct-current voltage of a few kV, for example, 6 kV, is applied between the lower electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the laminated body 11b is provided, and the polarization processing may be performed by moving the laminated body 11b. Moving means for a known sheet-like material may be used to move the laminated body 11b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper electrode 16 is formed before the polarization processing.

Before the polarization processing, calender processing may be performed to smoothen the surface of the piezoelectric layer 12 using a heating roller or the like. By performing the calender processing, a thermal compression bonding process described below is able to be smoothly performed.

In this way, while the piezoelectric layer 12 of the laminated body 11b is subjected to the polarization processing, a sheet-like material 11c is prepared in which the upper colored layer 22 is formed on the upper protective layer 20 and the upper electrode 16 is formed on the upper colored layer 22. The sheet-like material 11c may be prepared by forming the upper colored layer 22 on the surface of the upper protective layer 20 using vacuum vapor deposition, sputtering, plating, application, printing, or the like and then forming a copper thin film or the like as the upper electrode 16 on the surface of the formed upper colored layer 22 using vacuum vapor deposition, sputtering, plating, or the like.

Figure 2E:
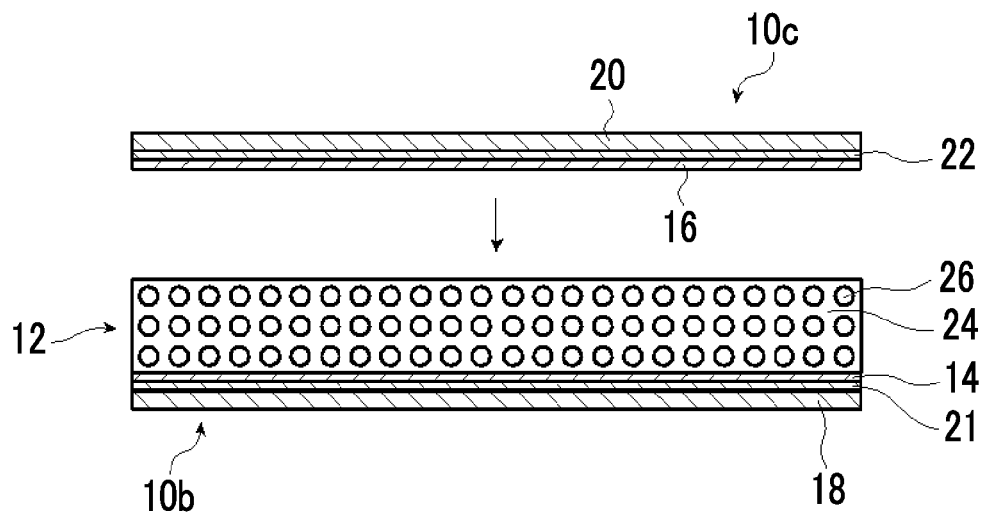
FIG. 2E is a conceptual view illustrating the example of the manufacturing method of the electroacoustic transduction film.

Next, as illustrated in FIG. 2E, the sheet-like material 11c is laminated on the laminated body 11b in which the piezoelectric layer 12 is subjected to the polarization processing while the upper electrode 16 faces the piezoelectric layer 12.

Furthermore, a laminated body of the laminated body 11b and the sheet-like material 11c is interposed between the upper protective layer 20 and the lower protective layer 18, and is subjected to the thermal compression bonding using a heating press device, a heating roller pair, or the like such that the transduction film 10 is prepared.

Next, an electroacoustic transducer using the electroacoustic transduction film of the present invention will be described with reference to FIGS. 3A to 3C.

Figure 3A:
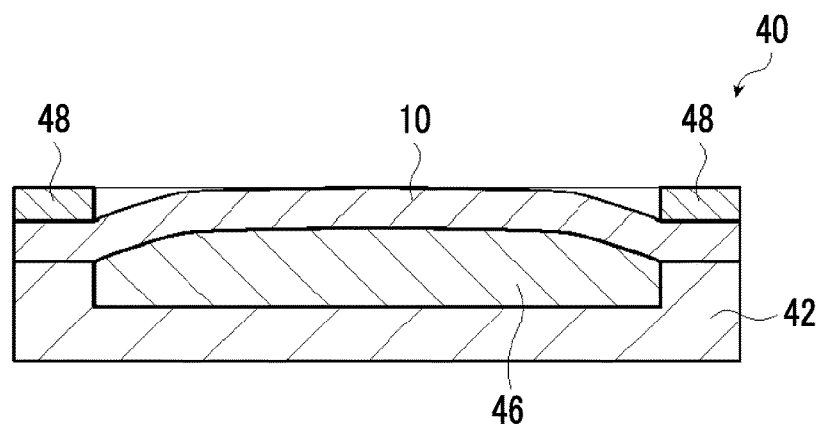
FIG. 3A is a sectional view schematically illustrating an example of an electroacoustic transducer of the present invention.
Figure 3B:
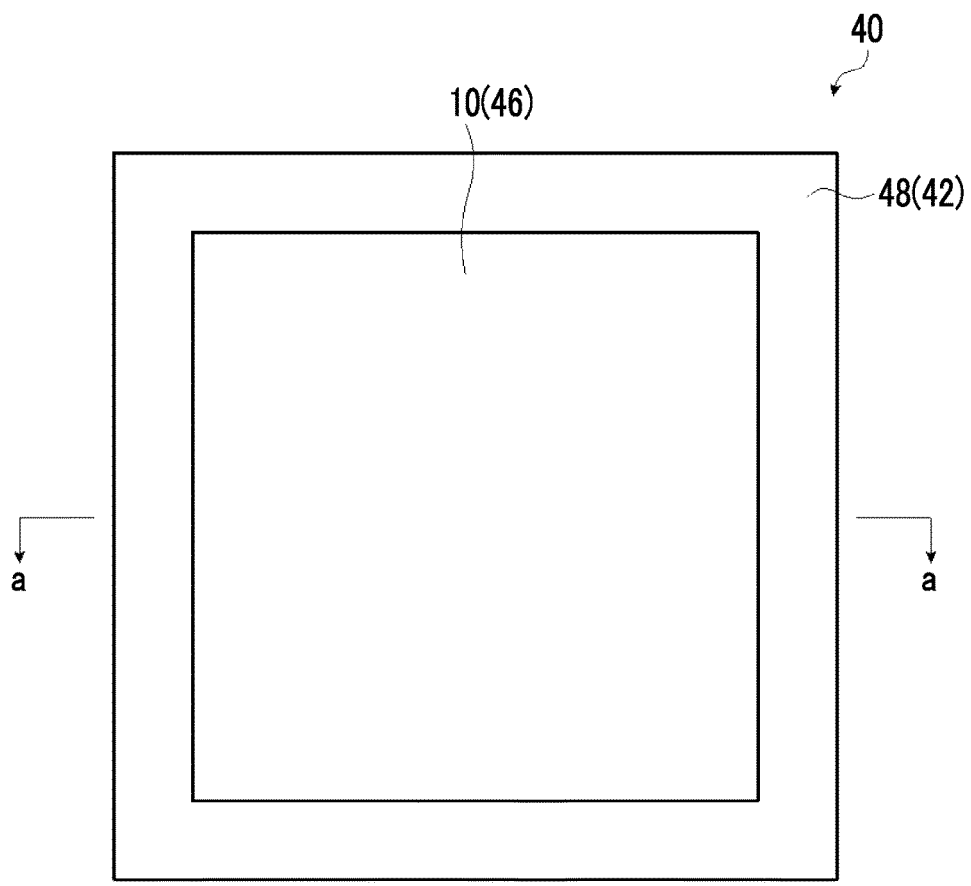
FIG. 3B is a plan view of FIG. 3A.
Figure 3C:
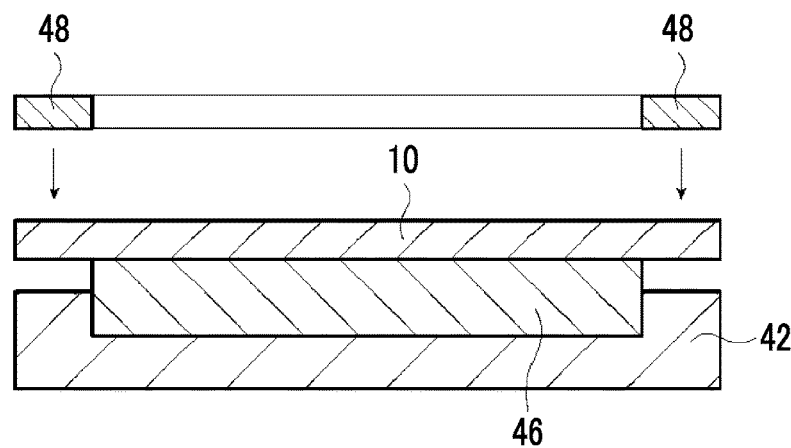
FIG. 3C is a sectional view illustrating a configuration of the electroacoustic transducer.

FIG. 3A is a sectional view conceptually illustrating an electroacoustic transducer 40, and FIG. 3B is a front view. That is, FIG. 3A is a sectional view taken along line a-a in FIG. 3B.

The electroacoustic transducer 40 uses the transduction film 10 as a vibration plate.

In the electroacoustic transducer 40, in a case where the transduction film 10 is stretched in an in-plane direction due to the application of a voltage to the transduction film 10, the transduction film 10 moves upward (in the radial direction of sound) in order to absorb the stretching. Conversely, in a case where the transduction film 10 is contracted in the in-plane direction due to application of a voltage to the transduction film 10, the transduction film 10 moves downward (toward a case 42) in order to absorb the contraction. The electroacoustic transducer 40 performs a conversion between a vibration (sound) and an electrical signal by the vibrations caused by repetition of stretching and contraction of the transduction film 10.

The electroacoustic transducer 40 is configured to include the transduction film 10, the case 42, a viscoelastic supporter 46, and a pressing member 48.

The case 42 is a holding member that holds the transduction film 10 and the viscoelastic supporter 46 together with the pressing member 48, and is a box-shaped case which is formed of plastic, metal, wood, or the like and has an open surface. As illustrated in the figure, the case 42 has a thin hexahedral shape, and one of the largest surfaces is the open surface. The open portion has a regular quadrilateral shape. The 42 accommodates the viscoelastic supporter 46 therein.

The viscoelastic supporter 46 has moderate viscosity and elasticity, holds the transduction film 10 in a bent state, and imparts a constant mechanical bias at any place of the transduction film 10 to efficiently convert the stretching and contracting movement of the transduction film 10 into a forward and rearward movement (a movement in the direction perpendicular to the surface of the transduction film).

In the illustrated example, the viscoelastic supporter 46 has a quadrangular prism shape having a bottom surface shape substantially equal to the bottom surface of the case 42. In addition, the height of the viscoelastic supporter 46 is larger than the depth of the case 42.

The material of the viscoelastic supporter 46 is not particularly limited as long as the material has moderate viscosity and elasticity and suitably deforms without impeding the vibration of the piezoelectric film. As an example, wool felt, nonwoven fabric of wool felt including rayon or PET, a foamed material (foamed plastic) such as glass wool or polyurethane, polyester wool, a laminate of a plurality of sheets of paper, a magnetic fluid, a coating material, and the like are exemplified.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 kg/m$^3$, and more preferably 100 to 300 kg/m$^3$. In a case where glass wool is used as the viscoelastic supporter, the specific gravity thereof is preferably 10 to 100 kg/m$^3$.

The pressing member 48 is for supporting the transduction film 10 in a state of being pressed against the viscoelastic supporter 46, and is a member formed of plastic, metal, wood, or the like in a regular quadrilateral shape with an opening at the center. The pressing member 48 has the same shape as the open surface of the case 42, and the shape of the opening is the same regular quadrilateral shape as the open portion of the case 42.

The electroacoustic transducer 40 is configured by accommodating the viscoelastic supporter 46 in the case 42, covering the case 42 and the viscoelastic supporter 46 with the transduction film 10, and fixing the pressing member 48 to the case 42 in a state in which the periphery of the transduction film 10 is brought into contact with the open surface of the case 42 by the pressing member 48.

A method of fixing the pressing member 48 to the case 42 is not particularly limited, and various known methods such as a method using screws or bolts and nuts and a method using a holding device are able to be used.

In the electroacoustic transducer 40, the height (thickness) of the viscoelastic supporter 46 is greater than the height of the inner surface of the case 42. That is, in a state before the transduction film 10 and the pressing member 48 are fixed, the viscoelastic supporter 46 is in a state protruding from the upper surface of the case 42 (see FIG. 3C).

Therefore, in the electroacoustic transducer 40, the viscoelastic supporter 46 is held in a state in which the viscoelastic supporter 46 is pressed downward by the transduction film 10 and decreases in thickness toward the peripheral portion of the viscoelastic supporter 46. That is, at least a portion of the principal surface of the transduction film 10 is held in a bent state. Accordingly, a bent portion is formed in at least a portion of the transduction film 10. In the electroacoustic transducer 40, the bent portion serves as a vibration surface. In the following description, the bent portion is also referred to as a vibration surface.

At this time, it is preferable that the entire surface of the viscoelastic supporter 46 is pressed in the surface direction of the transduction film 10 so that the thickness decreases over the entire surface. That is, it is preferable that the entire surface of the transduction film 10 is pressed and supported by the viscoelastic supporter 46.

In addition, it is preferable that the bent portion formed in this way gradually changes in curvature from the center to the peripheral portion. Accordingly, the resonance frequencies are distributed, resulting in a wider band.

In addition, in the electroacoustic transducer 40, the viscoelastic supporter 46 is in a state of being compressed more in the thickness direction as it approaches the pressing member 48. However, due to the static viscoelastic effect (stress relaxation), a constant mechanical bias can be maintained at any place of the transduction film 10. Accordingly, the stretching and contracting movement of the transduction film 10 is efficiently converted into a forward and rearward movement, so that it is possible to obtain a flat electroacoustic transducer 40 that is thin, achieves a sufficient sound volume, and has excellent acoustic properties.

In the electroacoustic transducer 40 having such a configuration, a region of the transduction film 10 corresponding to the opening of the pressing member 48 serves as the bent portion that actually vibrates. That is, the pressing member 48 is a portion that defines the bent portion.

In an electroacoustic transducer which uses a transduction film having piezoelectric properties, it is easy to increase the relative size of a vibration plate to the entire unit compared to a cone speaker generally having a circular vibration plate, and miniaturization is facilitated.

From the above viewpoint, the width of the edge portion of the pressing member 48 is preferably less than or equal to 20 mm, and preferably 1 mm to 10 mm.

Furthermore, it is preferable that the surface of the electroacoustic transducer 40 on the transduction film 10 side and the bent portion are similar. That is, it is preferable that the outer shape of the pressing member 48 and the shape of the opening are similar.

In addition, in the electroacoustic transducer 40, the pressing force of the viscoelastic supporter 46 against the transduction film 10 is not particularly limited, and is 0.005 to 1.0 MPa and particularly preferably about 0.02 to 0.2 MPa in terms of surface pressure at a position where the surface pressure is low.

Moreover, although the thickness of the viscoelastic supporter 46 is not particularly limited, the thickness thereof before being pressed is 1 to 100 mm, and particularly preferably 10 to 50 mm.

In the illustrated example, the configuration in which the viscoelastic supporter 46 having viscoelasticity is used is provided, but is not limited thereto, and a configuration using an elastic supporter having at least elasticity may be provided.

For example, a configuration including an elastic supporter having elasticity instead of the viscoelastic supporter 46 may be provided.

As the elastic supporter, natural rubber and various synthetic rubbers are exemplified.

Here, in the electroacoustic transducer 40 illustrated in FIG. 3A, the entire peripheral area of the transduction film 10 is pressed against the case 42 by the pressing member 48, but the present invention is not limited thereto.

That is, the electroacoustic transducer using the transduction film 10 is also able to use a configuration in which the transduction film 10 is pressed against and fixed to the upper surface of the case 42 by screws, bolts and nuts, holding devices, or the like, for example, at the four corners of the case 42 without using the pressing member 48.

An O-ring or the like may be interposed between the case 42 and the transduction film 10. With this configuration, a damper effect is able to be achieved, and it is possible to prevent the vibration of the transduction film 10 from being transmitted to the case 42, and to obtain excellent acoustic properties.

In addition, the electroacoustic transducer using the transduction film 10 may not have the case 42 that accommodates the viscoelastic supporter 46.

Figure 4:
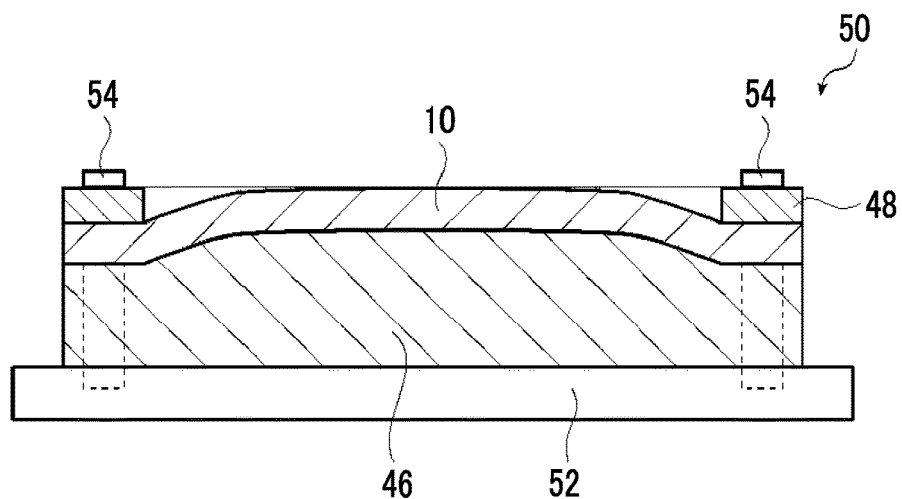
FIG. 4 is a sectional view conceptually illustrating another example of the electroacoustic transducer of the present invention.

That is, for example, as conceptually illustrated by a sectional view of an electroacoustic transducer 50 in FIG. 4, the viscoelastic supporter 46 is placed on a support plate 52 having rigidity, the transduction film 10 is placed to cover the viscoelastic supporter 46, the same pressing member 48 as described above is placed on the peripheral portion thereof. Next, a configuration in which the pressing member 48 is fixed to the support plate 52 by screws 54 or the like to press the viscoelastic supporter 46 together with the pressing member 48 is also able to be used.

The size of the support plate 52 may be greater than the viscoelastic supporter 46. Furthermore, by using various vibration plates formed of polystyrene, foamed PET, or carbon fiber as the material of the support plate 52, an effect of further amplifying the vibration of the electroacoustic transducer can be expected.

Moreover, the electroacoustic transducer is not limited to the configuration that presses the periphery, and for example, a configuration in which the center of the laminated body of the viscoelastic supporter 46 and the transduction film 10 is pressed by some means is also able to be used.

That is, various configurations are able to be used by the electroacoustic transducer as long as the transduction film 10 is held in a bent state.

Alternatively, a configuration in which a resin film is attached to the transduction film 10 to apply tension thereto (bend) may also be adopted. By configuring the transduction film 10 to be held with the resin film and causing the transduction film 10 to be held in a bent state, a flexible speaker is able to be obtained.

Alternatively, the transduction film 10 may be configured to be stretched over a bent frame.

In the example illustrated in FIGS. 3A and 3B, the configuration in which the transduction film 10 is pressed against the viscoelastic supporter 46 so as to be supported using the pressing member 48 is provided, but is not limited thereto. For example, a configuration in which the end portion of the transduction film is fixed to the rear surface side of the case 42 using the transduction film 10 which is larger than the open surface of the case 42 may be provided. That is, the case 42 and the viscoelastic supporter 46 disposed in the case 42 may be covered with the transduction film 10 which is larger than the open surface of the case 42, the end portion of the transduction film 10 may be pulled toward the rear surface side of the case 42 so the transduction film 10 is pressed against the viscoelastic supporter 46 to be bent with tension, and the end portion of the transduction film may be fixed to the rear surface side of the case 42.

Alternatively, for example, a configuration in which an airtight case is used, the open end of the case is covered and closed by the transduction film, gas is introduced into the case to apply a pressure to the transduction film, and the transduction film is thus held in a convexly swollen state may be provided.

Figure 5A:
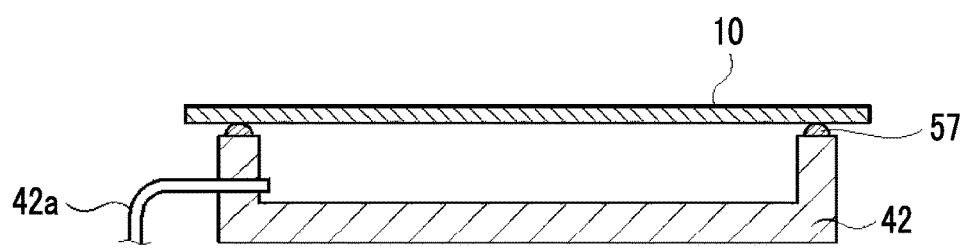
FIG. 5A is a sectional view illustrating another example of the electroacoustic transducer of the present invention.
Figure 5B:
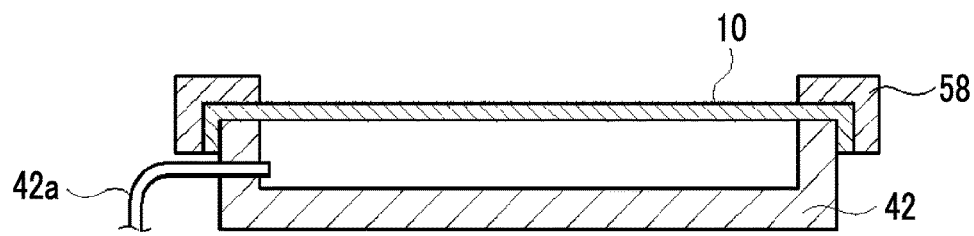
FIG. 5B is a sectional view illustrating another example of the electroacoustic transducer of the present invention.
Figure 5C:
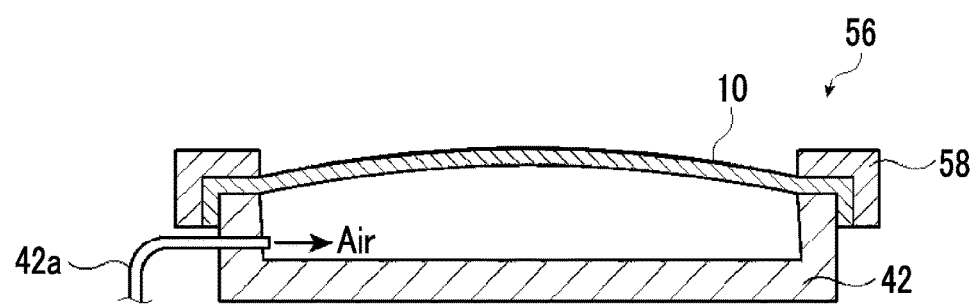
FIG. 5C is a sectional view illustrating another example of the electroacoustic transducer of the present invention.

For example, an electroacoustic transducer 56 illustrated in FIG. 5C is exemplified.

First, as illustrated in FIG. 5A, the electroacoustic transducer 56 uses an object having airtightness as the same case 42 and is provided with a pipe 42a for introducing air into the case 42.

An O-ring 57 is provided on the upper surface of the end portion on the open side of the case 42 and is covered with the transduction film 10 to close the open surface of the case 42.

Next, as illustrated in FIG. 5B, a frame-shaped pressing lid 58 having an inner periphery substantially the same as the outer periphery of the case 42 and an approximately L-shaped cross section is fitted to the outer periphery of the case 42 (the O-ring 57 is omitted in FIGS. 5B and 5C).

Accordingly, the transduction film 10 is pressed against and fixed to the case 42 such that the inside of the case 42 is airtightly closed by the transduction film 10.

Furthermore, as illustrated in FIG. 5C, air is introduced from the pipe 42a into the case 42 (a closed space formed by the case 42 and the transduction film 10) to apply a pressure to the transduction film 10, and the transduction film 10 is thus held in a convexly swollen state, thereby forming the electroacoustic transducer 56.

The pressure in the case 42 is not limited, and may be the atmospheric pressure or higher such that the transduction film 10 is convexly swollen.

The pipe 42a may be fixed or detachable. In a case where the pipe 42a is detached, it is natural that the detaching portion of the pipe is airtightly closed.

In addition, in the electroacoustic transducer 40 illustrated in FIG. 3A, the transduction film 10 is pressed by the viscoelastic supporter 46 and is held in a state in which the principal surface thereof is bent convexly. In this way, the configuration for holding the transduction film 10 in a bent state is not particularly limited.

Figure 6A:
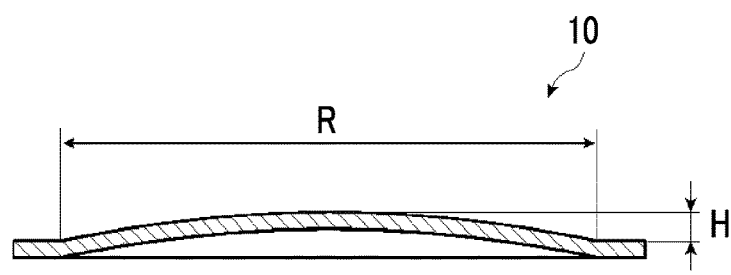
FIG. 6A is a sectional view illustrating another example of the electroacoustic transduction film of the present invention.

For example, as illustrated in FIG. 6A, the transduction film 10 itself may be molded in advance into a convex shape or a concave shape. In that time, the entirety of the transduction film 10 may be molded into a convex shape or a concave shape, or a portion of the transduction film may be molded into a convex portion (concave portion). A forming method of the convex portion is not particularly limited, and various known processing methods of resin films are able to be used. For example, the convex portion (concave portion) is able to be formed by a vacuum pressure molding method or a forming method such as embossing.

As described above, by forming the convex portion in the transduction film itself, it is possible to prevent the viscoelastic supporter from being deformed with the lapse of time or prevent a change in sound pressure due to the release of air, which is preferable.

Furthermore, in the case where the convex portion is formed in the transduction film, the shape of the convex portion is not particularly limited. The shape of the convex portion is preferably a portion of a sphere or a portion of a spheroid, and the shape of the convex portion as viewed in a direction perpendicular to the principal surface of the transduction film is preferably a substantially circular shape or a substantially elliptical shape. At this time, the ratio H/D of the height H of the convex portion to the diameter (the minor axis in a case of an ellipse and the length of the short side in a case of a rectangle) D of the convex portion is preferably more than 0 and less than or equal to 0.15, more preferably more than or equal to 0.003 and less than or equal to 0.15, and particularly preferably more than or equal to 0.005 and less than or equal to 0.10.

By setting the ratio H/D of the height H of the convex portion to the diameter D of the convex portion to be in the range, the sound pressure can be further improved.

In addition, in a case where the transduction film having the convex portion is assembled into the electroacoustic transducer, it is preferable that the end edge portion of the convex portion is pressed and fixed by the pressing member. That is, it is preferable that the shape of the convex portion and the shape of the opening of the pressing member as viewed in the direction perpendicular to the principal surface of the transduction film are substantially the same.

Figure 6B:
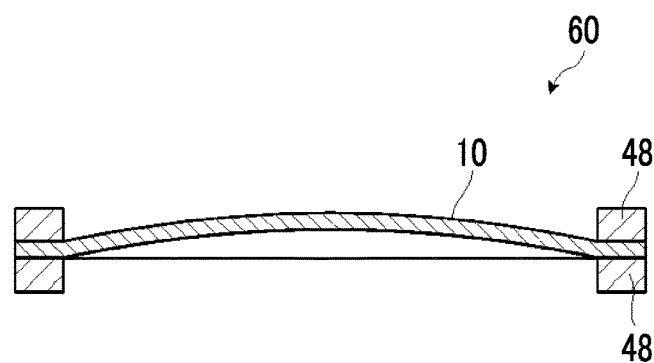
FIG. 6B is a sectional view illustrating an example of the electroacoustic transducer that uses the electroacoustic transduction film in FIG. 6A.

In addition, for example, as in an electroacoustic transducer 60 illustrated in FIG. 6B, a configuration in which the end edge portion of the convex portion of the transduction film 10 is interposed between the two pressing members 48, and thus the transduction film is supported to be able to vibrate may be provided.

In a case where the transduction film having the convex portion is assembled into the electroacoustic transducer, the transduction film may be disposed to cause the convex portion to face outward or to face inward (that is, to cause the concave portion to face outward).

In addition, since the transduction film itself having the convex portion is formed in a convex shape, the viscoelastic supporter for bending the transduction film or a configuration to apply a pressure to the inside of the case is not necessary. However, the transduction film may also be used in combination with such a configuration.

As described above, the electroacoustic transduction film of the present invention and the electroacoustic transducer are described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 2A to 2E described above, the transduction film 10 illustrated in FIG. 1 was prepared.

First, cyanoethylated PVA (CR-V manufactured by Shin-Etsu Chemical Co., Ltd.) was dissolved in methyl ethyl ketone (MEK) at the following compositional ratio. Thereafter, PZT particles were added to this solution at the following compositional ratio, and were dispersed by using a propeller mixer (rotation speed 2000 rpm), and thus a coating material for forming the piezoelectric layer 12 was prepared.

| | |
|---|---|
| PZT Particles | 1000 parts by mass |
| Cyanoethylated PVA | 100 parts by mass |
| MEK | 600 parts by mass |

In addition, the PZT particles were obtained by sintering commercially available PZT raw material powder at 1000° C. to 1200° C. and thereafter crushing and classifying the resultant so as to have an average particle diameter of 3.5 µm.

On the other hand, the sheet-like materials 11a and 11c were prepared in which a nickel thin film having a thickness of 20 nm was vacuum vapor deposited on a PET film having a thickness of 4 µm and a copper thin film having a thickness of 0.1 µm was vacuum vapor deposited on the nickel thin film. That is, in this example, the upper electrode 14 and the lower electrode 16 are copper vapor deposition thin films having a thickness of 0.1 µm, the upper colored layer 22 and the lower colored layer 21 are nickel vapor deposition thin films having a thickness of 20 nm, and the upper protective layer 20 and the lower protective layer 18 are PET films having a thickness of 4 µm.

In order to obtain good handling ability during the process, as the PET film, a film with a separator (temporary supporter PET) having a thickness of 50 µm attached thereto was used, and the separator of each protective layer was removed after thermal compression bonding of the sheet-like material 11c.

Here, the electrical resistivity of nickel as the colored layer is $7 \times 10^{-7}$ Ωm.

In a state in which the nickel thin film is formed on the PET film before forming the copper thin film, the transmission density was measured with a transmission densitometer (X-Rite 310 manufactured by X-Rite Inc.). The measured transmission density was 0.6.

The coating material for forming the piezoelectric layer 12 prepared as described above was applied onto the lower electrode 14 of the sheet-like material 11a (the copper vapor deposition thin film) by using a slide coater. Furthermore, the coating material was applied such that the film thickness of the coating film after being dried was 40 µm.

Next, a material in which the coating material was applied onto the sheet-like material 11a was heated and dried in an oven at 120° C. such that MEK evaporated. Accordingly, the laminated body 11b was prepared in which the lower colored layer 21 made of nickel was provided on the lower protective layer 18 made of PET, the lower electrode 14 made of copper was provided on the lower colored layer 21, and the piezoelectric layer 12 (piezoelectric layer) having a thickness of 40 µm was formed thereon.

The piezoelectric layer 12 of the laminated body 11b was subjected to the polarization processing by corona poling illustrated in FIGS. 2C and 2D. Furthermore, the polarization processing was performed by setting the temperature of the piezoelectric layer 12 to 100° C., and applying a direct-current voltage of 6 kV between the lower electrode 14 and the corona electrode 30 so as to cause corona discharge to occur.

The sheet-like material 11c was laminated on the laminated body 11b which was subjected to the polarization processing while the application surface in which a mixture of cyanoethylated pullulan and cyanoethylated PVA (CR-M manufactured by Shin-Etsu Chemical Co., Ltd.) was applied onto the upper electrode 16 (copper thin film side) so as to have a thickness of 0.3 µm, faced the piezoelectric layer 12.

Next, the laminated body of the laminated body 11b and the sheet-like material 11c was subjected to thermal compression bonding at 120° C. by using a laminator device, and thus the piezoelectric layer 12 adhered to the upper electrode 16 and the lower electrode 14 such that the transduction film 10 was prepared.

The electroacoustic transducer 40 was prepared by assembling the prepared transduction film 10 into the case 42.

The case 42 is a box-shaped container having an open surface, and a plastic rectangular container having an open surface size of 172×302 mm and a depth of 9 mm, was used.

In addition, the viscoelastic supporter 46 was disposed in the case 42. The viscoelastic supporter 46 was made of glass wool having a height of 40 mm before assembly and a density of 16 kg/m³.

The transduction film 10 was disposed so as to cover the viscoelastic supporter 46 and the opening of the case 42, the peripheral portion thereof was fixed by the pressing member 48 such that an appropriate tension and curvature were applied to the transduction film 10 by the viscoelastic supporter 46, thereby preparing the electroacoustic transducer 40. As a result, the transduction film 10 was bent into a convex shape like a convex lens.

Examples 2 to 6

The electroacoustic transduction film 10 and the electroacoustic transducer 40 were prepared in the same manner as in Example 1 except that the thickness of the piezoelectric layer 12 was changed as shown in Table 1 below.

Example 7

The electroacoustic transduction film 10 and the electroacoustic transducer 40 were prepared in the same manner as in Example 3 except that the piezoelectric layer 12 was formed by using the following as the coating material for forming the piezoelectric layer 12.

| | |
|---|---|
| PZT Particles | 1000 parts by mass |
| BaTiO$_3$ Particles | 90 parts by mass |
| Cyanoethylated PVA | 85 parts by mass |
| MEK | 600 parts by mass |

As the BaTiO$_3$ particles, BT-05 (average particle diameter 0.5 μm manufactured by Sakai Chemical Industry Co., Ltd.) was used.

Examples 8 to 10

The electroacoustic transduction film 10 and the electroacoustic transducer 40 were prepared in the same manner as in Example 3 except that the thickness of the colored layer was changed as shown in Table 1 below.

Example 11

The electroacoustic transduction film 10 and the electroacoustic transducer 40 were prepared in the same manner as in Example 3 except that a sheet-like material in which a nickel thin film having a thickness of 20 nm was vacuum vapor deposited on one surface of a PET film having a thickness of 4 μm and a copper thin film having a thickness of 0.1 μm was vacuum vapor deposited on the other surface was used as the sheet-like materials 11a and 11c.

That is, the electroacoustic transduction film 10 of Example 11 has a configuration in which the lower electrode 14, the lower protective layer 18 as the supporter, and the lower colored layer 21 were sequentially laminated on one surface of the piezoelectric layer 12 and the upper electrode 16, the upper protective layer 20 as the supporter, and the upper colored layer 22 were sequentially laminated on the other surface of the piezoelectric layer 12.

In the column of the lamination order in Table 1, a configuration in which the thin film electrode, the colored layer, and the protective layer are laminated in this order from the piezoelectric layer 12 side is referred to as "A", and a configuration in which the thin film electrode, the protective layer, and the colored layer are laminated in this order from the piezoelectric layer 12 side is referred to as "B".

Example 12

The electroacoustic transduction film 10 and the electroacoustic transducer 40 were prepared in the same manner as in Example 3 except that the following was used as the coating material for forming the colored layer and the colored layer was formed using an application method.

| | |
|---|---|
| Carbon black aqueous dispersion | 1000 parts by mass |
| Acrylic resin aqueous dispersion | 1000 parts by mass |
| Crosslinking agent | 240 parts by mass |

As the carbon black aqueous dispersion, MF-5630 black (manufactured by Dainichiseika Color & Chemicals Mfg. Co., Ltd.) was used, as the acrylic resin aqueous dispersion, JURYMER ET-410 (manufactured by Toagosei Co., Ltd.) was used, and as the crosslinking agent, EPOCROS WS-700 (manufactured by Nippon Shokubai Co., Ltd.) was used.

In Table 1, CB refers to carbon black.

Examples 13 to 15

The electroacoustic transduction film 10 and the electroacoustic transducer 40 were prepared in the same manner as in Example 3 except that the forming material and thickness of the colored layer were changed as shown in Table 1 below.

Example 16

The electroacoustic transduction film 10 was prepared by molding the electroacoustic transduction film 10 prepared in the same manner as in Example 3 into a shape having the convex portion as illustrated in FIG. 6A using a vacuum pressure molding method.

The shape of the convex portion was a shape of a portion of a sphere. In addition, the diameter D of the convex portion as viewed in the direction perpendicular to the principal surface of the transduction film 10 was set to 40 mm, and the height thereof was set to 0.5 mm. That is, the ratio H/D of the height H to the diameter D of the convex portion was set to 0.01.

The electroacoustic transducer 60 as illustrated in FIG. 6B was prepared by interposing the end edge portion of the prepared transduction film 10 between the two pressing members 48.

Here, a sine wave at 1 kHz and 0.5 $V_{0-P}$ was input to the electroacoustic transducer 60, and the amplitude of the central portion of the transduction film was measured with a laser Doppler vibrometer. The measured amplitude was 30 nm.

Examples 17 and 18

The electroacoustic transduction film 10 and the electroacoustic transducer 60 were prepared in the same manner as in Example 16 except that the height H of the convex portion was changed to 4 mm and 6 mm and the ratio H/D of the height H to the diameter D was changed to 0.10 and 0.15.

The amplitude of the central portion of the transduction film was measured in the same manner as in Example 16. The measured amplitude was 22 nm and 17 nm.

Comparative Example 1

An electroacoustic transduction film and an electroacoustic transducer were prepared in the same manner as in Example 3 except that no colored layer was provided.

Comparative Example 2

An electroacoustic transduction film and an electroacoustic transducer were prepared in the same manner as in Example 3 except that the thickness of a protective layer was set to 20 μm and no colored layer was provided.

Comparative Example 3

An electroacoustic transduction film and an electroacoustic transducer were prepared in the same manner as in Example 18 except that no colored layer was provided.

[Evaluation]

<Appearance>

The prepared electroacoustic transduction film was left under an environment with a temperature of 70° C. and a humidity of 80% RH for 150 hours and the appearance thereof was visually observed to evaluate whether or not a change in the appearance due to rusting of the thin film electrode was visible.

A: No change
B: Slight rust visible
C: Rust present

<Scratch Resistance>

The surface of the prepared electroacoustic transduction film was rubbed with steel wool (#0000) in a continuous loading scratching intensity tester (HEIDON-18S) under conditions of a load of 500 g, a speed of 1000 mm/min, and 10 reciprocations, and after the rubbing, whether or not the thin film electrode was visible was evaluated.

A: Invisible
B: Slightly visible
C: Visible

<Adhesiveness>

A test peeling test was conducted on the prepared sheet-like material 10a.

Specifically, 11 scratches were made on the surface of the thin film electrode side of the sheet-like material 10a in each of the vertical and horizontal directions at an interval of 1 mm using a razor. A mylar tape having a width of 20 mm was attached to the top thereof and was rapidly peeled off in a 90° direction. After the peeling, the number of peeled squares was counted and evaluated according to the following evaluation standard.

A: Remaining area ratio of 50% or more
B: Remaining area ratio of 25% or more and less than 50%
C: Remaining area ratio of less than 25%

<Sound Pressure>

Examples 1 to 15 and Comparative Example 1 and 2

The sound pressure level of the prepared electroacoustic transducer was measured.

Specifically, a microphone was placed to face the center of the transduction film of the electroacoustic transducer at a position of 0.5 m apart therefrom, a sine wave at 1 kHz and 10 $V_{0-P}$ was input between the upper electrode and the lower electrode of the electroacoustic transducer, and the sound pressure level was measured.

Based on the difference from the sound pressure level of Comparative Example 1, evaluation was made as follows.

A: +1.0 dB or more
B: less than +1.0 dB and −0.5 dB or more
C: less than −0.5 dB and −1.5 dB or more
D: less than −1.5 dB and −3.0 dB or more
E: less than −3.0 dB Evaluation results are shown in Table 1.

Examples 16 to 18 and Comparative Example 3

The sound pressure level of the prepared electroacoustic transducer was measured.

Specifically, a microphone was placed to face the center of the transduction film of the electroacoustic transducer at a position of 0.1 m apart therefrom, a sine wave at 1 kHz and 10 $V_{0-P}$ was input between the upper electrode and the lower electrode of the electroacoustic transducer, and the sound pressure level was measured.

Based on the difference from the sound pressure level of Comparative Example 3, evaluation was made as follows.

A: +1.0 dB or more
B: less than +1.0 dB and −0.5 dB or more
C: less than −0.5 dB and −1.5 dB or more
D: less than −1.5 dB and −3.0 dB or more
E: less than −3.0 dB Evaluation results are shown in Table 2.

TABLE 1

| | Electroacoustic transduction film | | | | | | | |
|---|---|---|---|---|---|---|---|---|
| | Protective layer (supporter) | | Colored layer | | | | Thin film electrode | Piezoelectric layer |
| | Lamination order | Kind | Thickness [nm] | Kind | Electrical resistivity [Ωm] | Thickness [nm] | Transmission density [—] | Kind | Piezoelectric body particles |
| Example 1 | A | PET | 4 | Ni | $7 * 10^{-3}$ | 20 | 0.6 | Cu | PZT |
| Example 2 | A | PET | 4 | Ni | $7 * 10^{-8}$ | 20 | 0.6 | Cu | PZT |
| Example 3 | A | PET | 4 | Ni | $7 * 10^{-8}$ | 20 | 0.6 | Cu | PZT |
| Example 4 | A | PET | 4 | Ni | $7 * 10^{-8}$ | 20 | 0.6 | Cu | PZT |
| Example 5 | A | PET | 4 | Ni | $7 * 10^{-6}$ | 20 | 0.6 | Cu | PZT |
| Example 6 | A | PET | 4 | Ni | $7 * 10^{-6}$ | 20 | 0.6 | Cu | PZT |
| Example 7 | A | PET | 4 | Ni | $7 * 10^{-8}$ | 20 | 0.6 | Cu | PZT |
| Example 8 | A | PET | 4 | Ni | $7 * 10^{-8}$ | 40 | 0.7 | Cu | PZT |
| Example 9 | A | PET | 4 | Ni | $7 * 10^{-3}$ | 10 | 0.3 | Cu | PZT |
| Example 10 | A | PET | 4 | Ni | $7 * 10^{-3}$ | 5 | 0.1 | Cu | PZT |
| Example 11 | B | PET | 4 | Ni | $7 * 10^{-3}$ | 20 | 0.6 | Cu | PZT |
| Example 12 | A | PET | 4 | CB | $2 * 10^{-5}$ | 1000 | 0.3 | Cu | PZT |
| Example 13 | A | PET | 4 | Ti | $4 * 10^{-7}$ | 20 | 0.6 | Cu | PZT |
| Example 14 | A | PET | 4 | Au | $2 * 10^{-6}$ | 20 | 0.6 | Cu | PZT |
| Example 15 | A | PET | 4 | Al | $3 * 10^{-6}$ | 20 | 0.6 | Cu | PZT |
| Comparative Example 1 | A | PET | 4 | — | — | — | — | Cu | PZT |
| Comparative Example 2 | A | PET | 20 | — | — | — | — | Cu | PZT |

TABLE 1-continued

| | Electroacoustic transduction film Piezoelectric layer | | | Evaluation | | | |
|---|---|---|---|---|---|---|---|
| | Viscoelastic matrix | | Film thickness | Change in | Scratch | | Sound |
| | Kind | Additive | [μm] | appearance | resistance | Adhesiveness | pressure |
| Example 1 | Cyanoethylated PVA | — | 40 | A | A | A | C |
| Example 2 | Cyanoethylated PVA | — | 25 | A | A | A | B |
| Example 3 | Cyanoethylated PVA | — | 20 | A | A | A | B |
| Example 4 | Cyanoethylated PVA | — | 15 | A | A | A | B |
| Example 5 | Cyanoethylated PVA | — | 10 | A | A | A | C |
| Example 6 | Cyanoethylated PVA | — | 8 | A | A | A | D |
| Example 7 | Cyanoethylated PVA | $TiBaO_3$ | 20 | A | A | A | A |
| Example 8 | Cyanoethylated PVA | — | 20 | A | A | A | C |
| Example 9 | Cyanoethylated PVA | — | 20 | B | A | A | B |
| Example 10 | Cyanoethylated PVA | — | 20 | B | A | A | B |
| Example 11 | Cyanoethylated PVA | — | 20 | A | C | A | B |
| Example 12 | Cyanoethylated PVA | — | 20 | A | A | B | C |
| Example 13 | Cyanoethylated PVA | — | 20 | A | A | B | C |
| Example 14 | Cyanoethylated PVA | — | 20 | A | A | A | B |
| Example 15 | Cyanoethylated PVA | — | 20 | A | A | A | B |
| Comparative Example 1 | Cyanoethylated PVA | — | 20 | C | A | A | — |
| Comparative Example 2 | Cyanoethylated PVA | — | 20 | B | A | A | E |

TABLE 2

| | Electroacoustic transduction film | | | | | | | | |
|---|---|---|---|---|---|---|---|---|---|
| | | Protective layer | | Colored layer | | | Thin film electrode | Piezoelectric layer | |
| | Lamination order | Kind | Thickness [nm] | Kind | Electrical resistivity [Ωm] | Thickness [nm] | Transmission density [—] | Kind | Piezoelectric body particles | Viscoelastic matrix Kind |
| Example 16 | A | PET | 4 | Ni | $7 * 10^{-8}$ | 20 | 0.6 | Cu | PZT | Cyanoethylated PVA |
| Example 17 | A | PET | 4 | Ni | $7 * 10^{-8}$ | 20 | 0.6 | Cu | PZT | Cyanoethylated PVA |
| Example 18 | A | PET | 4 | Ni | $7 * 10^{-8}$ | 20 | 0.6 | Cu | PZT | Cyanoethylated PVA |
| Comparative Example 3 | A | PET | 4 | — | — | — | — | Cu | PZT | Cyanoethylated PVA |

| | Electroacoustic transduction film Piezoelectric layer | | | Amplitude | Evaluation | | | |
|---|---|---|---|---|---|---|---|---|
| | Viscoelastic matrix Additive | Film thickness [μm] | Mold H/D | $1 V_{0-P}$ 1 kHz [nm] | Change in appearance | Scratch resistance | Adhesiveness | Sound pressure |
| Example 16 | — | 20 | 0.01 | 30 | A | A | A | A |
| Example 17 | — | 20 | 0.10 | 22 | A | A | A | A |
| Example 18 | — | 20 | 0.15 | 17 | A | A | A | B |
| Comparative Example 3 | — | 20 | 0.15 | 17 | C | A | A | — |

It can be seen from Tables 1 and 2 that a change in the appearance due to rusting of the thin film electrode in Examples 1 to 18 of the electroacoustic transduction films of the present invention is less likely to be visible than in Comparative Examples 1 to 3.

In addition, it can be seen that the sound pressure in Examples 1 to 8 of the electroacoustic transducers using the electroacoustic transduction film of the present invention is higher than in Comparative Examples 1 to 3.

It can be seen from the comparison between Examples 1 to 6 that the thickness of the piezoelectric layer is preferably 8 μm to 40 μm, more preferably 10 μm to 35 μm, and particularly preferably 15 μm to 25 μm.

In addition, it can be seen from the comparison between Examples 3 and 7 that it is preferable to add dielectric particles of the viscoelastic matrix of the piezoelectric layer.

In addition, it can be seen from the comparison between Example 3 and Examples 8 to 10 that the thickness of the colored layer is preferably 5 nm to 40 nm and more preferably 15 nm to 25 nm.

In addition, it can be seen from the comparison between Example 3 and Example 11 that in the configuration in which the colored layer is disposed outward of the protective layer, there is a possibility that the colored layer may be scraped and the inside (thin film electrode) thereof may be visible, and thus it is preferable that the colored layer is disposed between the protective layer and the thin film electrode.

In addition, it can be seen from the comparison between Example 3 and Examples 12 to 15 that the forming material of the colored layer is preferably metal and is particularly preferably nickel, aluminum, or gold.

In addition, it can be seen from the comparison between Example 3 and Examples 16 to 18 that the sound pressure can be further improved by molding the electroacoustic transduction film into a shape having the convex portion. At this time, the ratio H/D of the height H to the diameter D of the convex portion is preferably more than 0 and less than or equal to 0.15, and more preferably more than or equal to 0.003 and less than or equal to 0.10.

From the above results, the effect of the present invention is obvious.

EXPLANATION OF REFERENCES

10: electroacoustic transduction film
11a, 11c: sheet-like material
11b: laminated body
12: piezoelectric layer
14: lower thin film electrode
16: upper thin film electrode
18: lower protective layer
20: upper protective layer
21: lower colored layer
22: upper colored layer
24: viscoelastic matrix
26: piezoelectric body particles
30: corona electrode
32: direct-current power source
40, 50, 60: electroacoustic transducer
42: case
46: viscoelastic supporter
48: pressing member
52: support plate
54: screw
57: O-ring
58: pressing lid

What is claimed is:

1. An electroacoustic transduction film comprising:
a polymer composite piezoelectric body in which piezoelectric body particles are dispersed in a viscoelastic matrix formed of a polymer material having viscoelasticity at a normal temperature;
a lower thin film electrode laminated on one principal surface of the polymer composite piezoelectric body;
a lower protective layer laminated on the lower thin film electrode;
an upper thin film electrode formed on the other principal surface of the polymer composite piezoelectric body;
an upper protective layer laminated on the upper thin film electrode; and
a colored layer laminated on at least one of a surface layer side of the upper thin film electrode and a surface layer side of the lower thin film electrode.

2. The electroacoustic transduction film according to claim 1,
wherein the colored layer is laminated at least one of between the upper thin film electrode and the upper protective layer or between the lower thin film electrode and the lower protective layer.

3. The electroacoustic transduction film according to claim 1,
wherein the colored layer is laminated on both principal surface sides of the polymer composite piezoelectric body.

4. The electroacoustic transduction film according to claim 2,
wherein the colored layer is laminated on both principal surface sides of the polymer composite piezoelectric body.

5. The electroacoustic transduction film according to claim 1,
wherein a transmission density of the colored layer is more than or equal to 0.3.

6. The electroacoustic transduction film according to claim 4,
wherein a transmission density of the colored layer is more than or equal to 0.3.

7. The electroacoustic transduction film according to claim 1,
wherein a thickness of the colored layer is less than or equal to 40 nm.

8. The electroacoustic transduction film according to claim 6,
wherein a thickness of the colored layer is less than or equal to 40 nm.

9. The electroacoustic transduction film according to claim 1,
wherein an electrical resistivity of the colored layer is less than or equal to $1 \times 10^{-7}$ Ωm.

10. The electroacoustic transduction film according to claim 8,
wherein an electrical resistivity of the colored layer is less than or equal to $1 \times 10^{-7}$ Ωm.

11. The electroacoustic transduction film according to claim 1,
wherein the colored layer is made of metal.

12. The electroacoustic transduction film according to claim 10,
wherein the colored layer is made of metal.

13. The electroacoustic transduction film according to claim 1,
wherein the colored layer is made of nickel.

14. The electroacoustic transduction film according to claim 12,
wherein the colored layer is made of nickel.

15. The electroacoustic transduction film according to claim 1,
wherein the polymer material has a cyanoethyl group.

16. The electroacoustic transduction film according to claim 14,
wherein the polymer material has a cyanoethyl group.

17. An electroacoustic transducer comprising:
the electroacoustic transduction film according to claim 1.

18. An electroacoustic transducer comprising:
the electroacoustic transduction film according to claim 16.

* * * * *